(12) United States Patent
Asano

(10) Patent No.: US 6,717,969 B2
(45) Date of Patent: Apr. 6, 2004

(54) SEMICONDUCTOR LASER DEVICE WHICH INCLUDES CURRENT CONFINEMENT STRUCTURE AND TRENCHES FORMED THROUGH CURRENT STOPPING LAYER DOWN TO ACTIVE LAYER

(75) Inventor: Hideki Asano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/195,762

(22) Filed: Jul. 16, 2002

(65) Prior Publication Data

US 2003/0013261 A1 Jan. 16, 2003

(30) Foreign Application Priority Data

Jul. 16, 2001 (JP) ........................................ 2001-215063

(51) Int. Cl.[7] .............................. H01S 5/00; H01L 29/06
(52) U.S. Cl. .............................. 372/46; 257/14; 257/23; 372/43
(58) Field of Search .................. 257/14, 25; 372/43–46

(56) References Cited

U.S. PATENT DOCUMENTS

| | | | | |
|---|---|---|---|---|
| 5,568,501 A | * | 10/1996 | Otsuka et al. | ................ 372/46 |
| 5,717,710 A | * | 2/1998 | Miyazaki et al. | ............. 372/50 |
| 6,118,800 A | * | 9/2000 | Kidoguchi et al. | ........... 372/46 |
| 6,292,502 B1 | * | 9/2001 | Shimada | ...................... 372/45 |
| 2001/0017870 A1 | * | 8/2001 | Hayakawa | .................... 372/40 |
| 2002/0177250 A1 | * | 11/2002 | Zhu et al. | ..................... 438/42 |

* cited by examiner

Primary Examiner—Allan R. Wilson
(74) Attorney, Agent, or Firm—Sughrue Mion, PLLC

(57) ABSTRACT

In a semiconductor laser device, a current confinement structure is realized by p-type and n-type layers formed above an active layer, where the p-type and n-type layers include a current stopping layer which has an opening for allowing current injection into only a predetermined stripe region of the active layer. In addition, a semiconductor layer is formed above the current confinement structure, and a pair of trenches are formed on both sides of the opening along the predetermined stripe region so as to extend from the semiconductor layer through the current stopping layer to at least the active layer. Further, an insulation film is formed on the semiconductor layer except that an area of the semiconductor layer located right above the predetermined stripe region is not covered by the insulation film, and an electrode is formed on the area of the semiconductor layer.

20 Claims, 11 Drawing Sheets

SEMICONDUCTOR LASER DEVICE WHICH INCLUDES CURRENT CONFINEMENT STRUCTURE AND TRENCHES FORMED THROUGH CURRENT STOPPING LAYER DOWN TO ACTIVE LAYER

BACKGROUND OF THE INVENTION

1. Field of the Invention

The present invention relates to a semiconductor laser device having a current stopping layer for confining current. The present invention also relates to a short-wavelength laser light source which converts a laser beam emitted from a semiconductor laser device having a current stopping layer for confining current, into a second harmonic laser beam.

2. Description of the Related Art

Generally, semiconductor laser devices used as a light source in information processing or printing equipment are required to efficiently operate with low-level current. In a conventional semiconductor laser device, which is disclosed, for example, in the registered Japanese patent No. 2746131, a current confinement region including a reverse bias pn junction is provided so that current is injected into only a very small region of an active layer. This semiconductor laser device basically includes the active layer formed over a substrate, and a current confinement structure realized by p-type and n-type layers being formed above the active layer and including a current stopping layer which has an opening for current injection into only a predetermined stripe region of the active layer.

FIG. 6 is a vertical cross-sectional view of a typical example of the above semiconductor laser device. In the semiconductor laser device of FIG. 6, an n-type InGaP lower cladding layer 11', semiconductor multiple layers 12', and a p-type InGaP first upper cladding layer 13' are formed on an n-type GaAs substrate 10', where the semiconductor multiple layers 12' include an i-type InGaAsP barrier layer, an i-type InGaAs quantum-well active layer, and an i-type InGaAsP barrier layer.

On the p-type InGaP first upper cladding layer 13', an n-type InGaP current stopping layer 31' and a p-type AlGaAs second upper cladding layer 23' are formed so that the n-type InGaP current stopping layer 31' exists on each side of the p-type AlGaAs second upper cladding layer 23', and a current confinement structure is realized by the n-type InGaP current stopping layer 31' and the p-type InGaP first upper cladding layer 13'. That is, the n-type InGaP current stopping layer 31' has an opening filled with the p-type AlGaAs second upper cladding layer 23', and a reverse bias state is realized by pn junctions between the n-type InGaP current stopping layer 31' and the p-type InGaP first upper cladding layer 13'.

In addition, a p-type AlGaAs third upper cladding layer 24', a p-type GaAs contact layer 14', an insulation film 15', and a p electrode 16' are formed in this order on the n-type InGaP current stopping layer 31' and the p-type AlGaAs second upper cladding layer 23'. Further, an n electrode 17' is formed on the lower surface of the n-type GaAs substrate 10'.

However, when the current confinement structure including the reverse pn junctions is provided, the pn junctions generate parasitic capacitance. Therefore, when the semiconductor laser device is modulated at high speed, the high-frequency components pass through the pn junctions, and thus high-frequency modulation is impossible.

In addition, when the semiconductor laser device having the above problem is used in a short-wavelength laser light source in combination with an optical wavelength conversion element which converts a laser beam emitted from the semiconductor laser device, into a second harmonic laser beam having a blue or green wavelength, it is difficult to use the short-wavelength laser light source for image recording or the like.

Further, when a semiconductor laser device used in reading data from an optical disk or the like is driven at high frequency for reducing noise, high-frequency components pass through the pn junctions, and the current is not efficiently injected into the active layer.

In FIG. 6, an equivalent circuit of the semiconductor laser device is also diagrammatically indicated. As illustrated in FIG. 6, it is considered that the semiconductor laser device of FIG. 6 has as resistance components an ohmic resistance R1 in the p electrode 16', a resistance R2 in the active layer, and resistances R3 and R4 in a distributed constant circuit which represents influences of the spread of the active layer in the lateral directions. In addition, the semiconductor laser device of FIG. 6 has as capacitance components a capacitance C1 existing between the p electrode 16', the insulation film 15', and the p-type GaAs contact layer 14', capacitances C2 and C3 generated by the pn junctions at the upper and lower boundaries of the n-type InGaP current stopping layer 31', a capacitance C4 generated by the junctions of the active layer, and a capacitance C5 in the above distributed constant circuit.

The parasitic capacitances C2 and C3 generated by the pn junctions at the upper and lower boundaries of the n-type InGaP current stopping layer 31' become most dominant in operation with high-speed modulation, and are the major cause of the damage to the high-frequency characteristics. In particular, the areas of the pn junctions almost correspond to the area of the semiconductor laser device. In addition, viewed as an electric circuit, the pn junctions extend in parallel with the active layer. Therefore, high-frequency components can pass through the current stopping layer, and the current is not efficiently injected into the active layer.

In order to solve the above problem, Japanese Patent Publication No. 5(1993)-9951 discloses a technique for reducing parasitic capacitance existing in a current stopping layer in a buried heterostructure semiconductor laser device, which is widely used for oscillation at the wavelength of 1.3 micrometers or greater. As illustrated in FIG. 7, the semiconductor laser device has a structure in which an active layer 201 is formed above an n-type InP substrate 200, and both sides of the active layer are etched off and filled with an n-type current stopping layer 205. In addition, a pair of trenches 208 having such a depth as to reach the substrate 200 are formed on both sides of the active layer 201 so that parasitic capacitance existing in the current stopping layer 205 is reduced. Further, in FIG. 7, reference numeral 202 denotes a p electrode, 203 denotes an insulation film, 204 denotes a p-type InGaAs contact layer, and 207 denotes an n electrode.

The above technique is very useful for reducing parasitic capacitance in the current stopping layer 205 which extends through the entire area of the semiconductor laser device. However, the above structure can be formed mainly in semiconductor laser devices made of InP-based materials. In particular, from the viewpoint of the production process and reliability, the above structure cannot be formed in semiconductor laser devices made of materials which can realize oscillation at a short wavelength of 1 micrometer or smaller.

The semiconductor laser devices which oscillate at a wavelength of 1.3 micrometers or greater are made of InP/InGaAsP materials, and the etching characteristics of the constituent materials of the structure of FIG. 7 are similar. That is, the structure of FIG. 7 can be realized because the formation of the trenches as illustrated in FIG. 7 is easy. On the other hand, the semiconductor laser devices which oscillate at a short wavelength of 1 micrometer or smaller are made of various materials as GaAs/AlGaAs/InGaP/InGaAsP/AlGaInP, and the etching characteristics of these materials are different. Therefore, formation of the trenches as illustrated in FIG. 7 is not easy in the semiconductor laser devices which oscillate at a short wavelength of 1 micrometer or smaller.

The registered Japanese patent No. 2746131 also discloses another technique for reducing parasitic capacitance. In the registered Japanese patent No. 2746131, this technique is applied to a semiconductor laser device having the construction as illustrated in FIG. 8, in which an n-type AlGaInP cladding layer 310', a multiple-quantum-well active layer 309', a p-type AlGaInP first cladding layer 308', a p-type GaAs contact layer 306', an insulation film 305', and a p electrode 304' are formed on an n-type GaAs substrate 311'. In addition, in FIG. 8, reference numeral 302' denotes a ridge stripe, 303' denotes a p-type InGaP protection layer, and 312' denotes an n electrode. According to this technique, an n-type GaAs current stopping layer 307' is located above the multiple-quantum-well active layer 309', and a pair of trenches 301' having such a depth as to reach the lower boundary of the n-type GaAs current stopping layer 307' are formed by etching.

According to the above technique, only two layers are etched. Therefore, the etching is not difficult. However, the capacitance C4 generated by the junctions of the active layer as illustrated by the equivalent circuit in FIG. 6 is not reduced. Thus, the reduction of the parasitic capacitance is insufficient, and therefore the operation speed of the semiconductor laser device is limited.

SUMMARY OF THE INVENTION

An object of the present invention is to provide a semiconductor laser device which can oscillate at a wavelength of 1 micrometer or smaller, and has an improved high-frequency characteristic.

Another object of the present invention is to provide a short-wavelength laser light source in which a wavelength-converted laser light can be modulated at high speed.

(1) According to the first aspect of the present invention, there is provided a semiconductor laser device including: a substrate; a semiconductor laser device comprising: a substrate; an active layer formed above the substrate; a current confinement structure which is realized by p-type and n-type layers being formed above the active layer and including a current stopping layer which has an opening for allowing current injection into only a predetermined stripe region of the active layer; a semiconductor layer formed above the current confinement structure; a pair of trenches formed on both sides of the opening along the predetermined stripe region so as to extend from the semiconductor layer through the current stopping layer to at least the active layer; an insulation film formed on the semiconductor layer except that an area of the semiconductor layer located right above the predetermined stripe region is not covered by the insulation film; and an electrode formed on the area of the semiconductor layer.

Preferably, the semiconductor laser device according to the first aspect of the present invention may also have one or a combination of the following additional features (i) to (iv).

(i) The pair of trenches may be separated by an interval of 100 micrometers or smaller.

(ii) The electrode may have at least one area each protruding in the lateral direction and being used for wire bonding.

(iii) The substrate may be made of GaAs, the active layer may be a quantum-well active layer made of an InGaAs material, and the semiconductor laser device may emit laser light having a wavelength within the range from 0.9 to 1.2 micrometers.

(iv) The substrate may be made of GaAs, the active layer may be made of an InGaP or AlGaInP material. In this case, the active layer is, for example, a quantum-well active layer, and the oscillation wavelength of the semiconductor laser device is, for example, within the range from 0.63 to 0.68 micrometers.

(2) According to the second aspect of the present invention, there is provided a short-wavelength laser light source comprising the semiconductor laser device according to the first aspect of the present invention and an optical wavelength conversion element, where the semiconductor laser device emits a fundamental harmonic laser beam; and the optical wavelength conversion element converts the fundamental harmonic laser beam into a second harmonic laser beam.

(3) The advantages of the present invention are explained below.

(i) In the semiconductor laser device according to the first aspect of the present invention, a pair of trenches are formed on both sides of the opening along the predetermined stripe region so as to extend from the semiconductor layer through the current stopping layer to at least the active layer. Therefore, the portions of the semiconductor layers outside the pair of trenches are electrically insulated from the portion of the semiconductor layers inside the pair of trenches, and therefore the pn junctions generated at the upper and lower boundaries of the current stopping layer inside the pair of trenches are reduced compared with the pn junctions generated at the upper and lower boundaries of the current stopping layer in the conventional semiconductor laser devices. Therefore, in the semiconductor laser device according to the first aspect of the present invention, it is possible to reduce the parasitic capacitance generated at the upper and lower boundaries of the current stopping layer.

In addition, in the semiconductor laser device according to the first aspect of the present invention, an insulation film is formed on the semiconductor layer located above the current confinement structure except that an area of the semiconductor layer located right above the predetermined stripe region is not covered by the insulation film, and the electrode is formed on the area of the semiconductor layer located right above the predetermined stripe region. Therefore, when the area of the semiconductor layer on which the insulation film is not formed is minimized, and the electrode is formed after the formation of the insulation film, the area of the semiconductor layer in contact with the electrode can be effectively limited (i.e., minimized) to the area of the semiconductor layer located right above the predetermined stripe region. Thus, the areas of the pn junctions which cause the parasitic capacitance can be minimized, and the parasitic capacitance can be further reduced.

As explained above, in the semiconductor laser device according to the first aspect of the present invention, the parasitic capacitance can be remarkably reduced. Therefore, the high-frequency characteristic can be greatly improved.

(ii) When the interval between the pair of trenches is 100 micrometers or smaller, the effect of reducing the parasitic capacitance is particularly enhanced. Details of the enhancement of the effect of reducing the parasitic capacitance in an embodiment of the present invention are explained later with reference to FIG. 3.

(iii) When the electrode has at least one area protruding in the lateral direction and being used for wire bonding, the width of the electrode except for the at least one area used for wire bonding can be reduced, and therefore the total area of the electrode can be minimized. Thus, the parasitic capacitance can be further reduced.

(iv) The short-wavelength laser light source according to the second aspect of the present invention uses the semiconductor laser device according to the first aspect of the present invention as a light source which emits a fundamental harmonic laser beam, and the semiconductor laser device according to the first aspect of the present invention has a greatly improved, high-frequency characteristic. Therefore, it is possible to obtain a second harmonic laser beam which has a short wavelength and can be modulated at high speed.

DESCRIPTION OF PREFERRED EMBODIMENTS

Embodiments of the present invention are explained in detail below with reference to drawings.

Construction of First Embodiment

Figure 1:
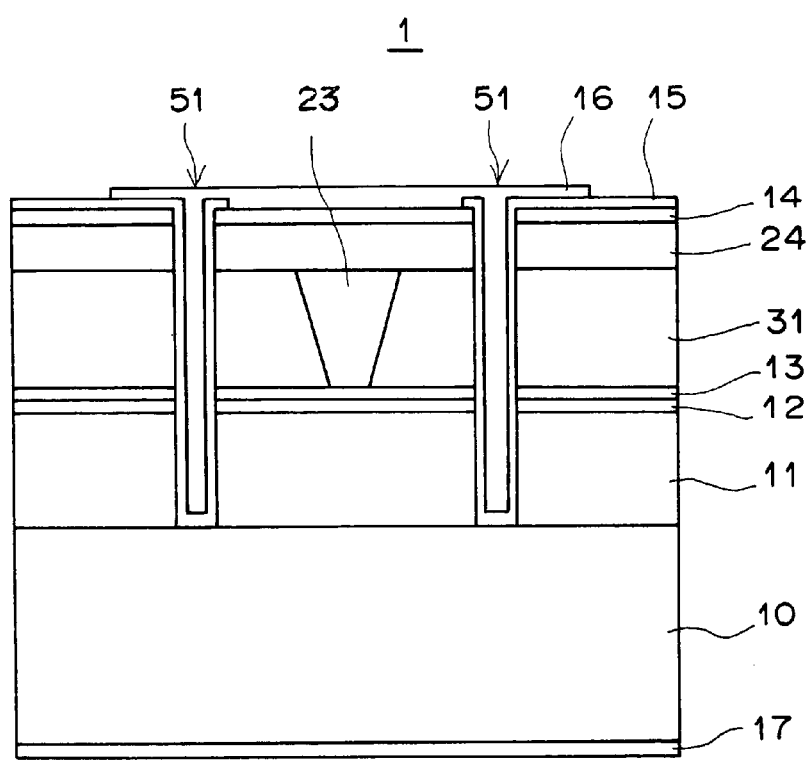
FIG. 1 is a vertical cross-sectional view of a semiconductor laser device as a first embodiment of the present invention.
Figure 2:
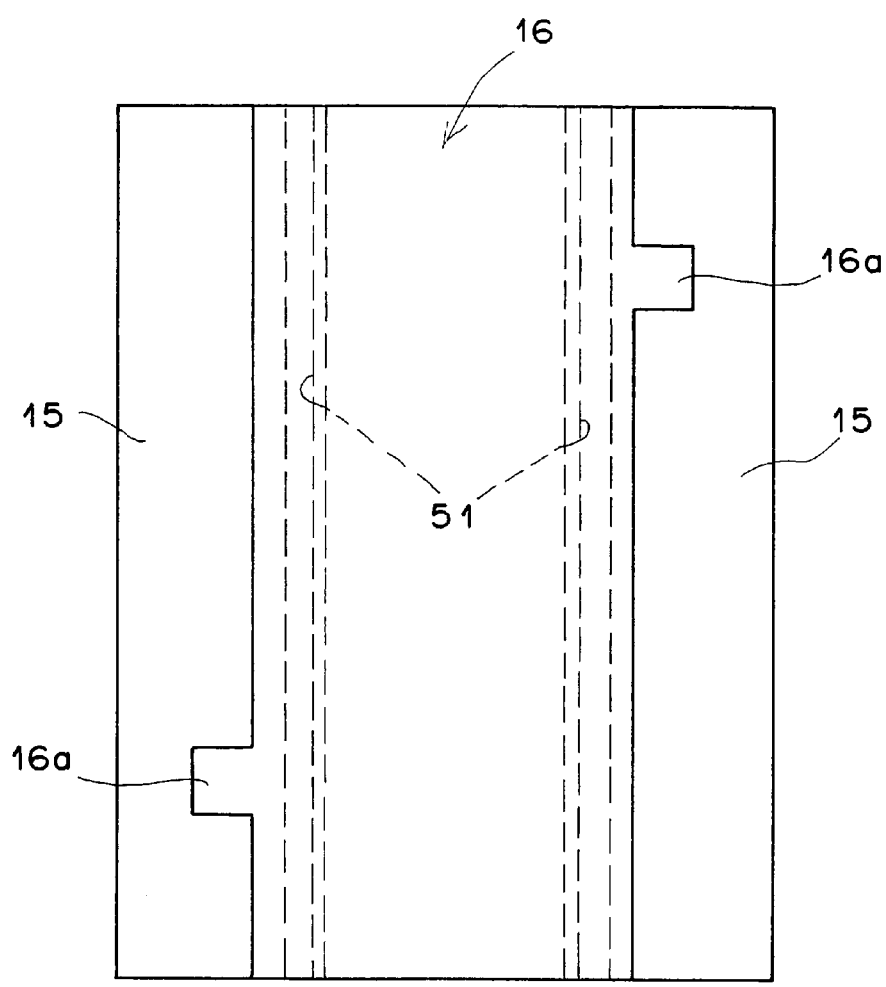
FIG. 2 is a plan view of the semiconductor laser device as the first embodiment of the present invention.

FIGS. 1 and 2 are vertical cross-sectional and plan views of the semiconductor laser device as the first embodiment of the present invention.

As illustrated in FIGS. 1 and 2, in the semiconductor laser device 1 as the first embodiment of the present invention, an n-type InGaP lower cladding layer 11, semiconductor multiple layers 12, and a p-type InGaP first upper cladding layer 13 are formed on an n-type GaAs substrate 10, where the semiconductor multiple layers 12 include an i-type InGaAsP barrier layer, an i-type InGaAs quantum-well active layer, and an i-type InGaAsP barrier layer. Hereinafter, the semiconductor multiple layers 12 are collectively referred to as an active layer 12.

On the p-type InGaP first upper cladding layer 13, an n-type InGaP current stopping layer 31 and a p-type AlGaAs second upper cladding layer 23 are formed so that the n-type InGaP current stopping layer 31 exists on each side of the p-type AlGaAs second upper cladding layer 23, and a current confinement structure is realized by the n-type InGaP current stopping layer 31 and the p-type InGaP first upper cladding layer 13. That is, the n-type InGaP current stopping layer 31 has an opening filled with the p-type AlGaAs second upper cladding layer 23, and a reverse bias state, which is explained later, is realized by pn junctions between the n-type InGaP current stopping layer 31 and the p-type InGaP first upper cladding layer 13.

In addition, a p-type AlGaAs third upper cladding layer 24 and a p-type GaAs contact layer 14 are formed in this order on the n-type InGaP current stopping layer 31 and the p-type AlGaAs second upper cladding layer 23.

Further, a pair of open trenches 51 are formed on both sides of the opening of the n-type InGaP current stopping layer 31 along a stripe region into which current is to be injected. The pair of open trenches 51 extend through the p-type GaAs contact layer 14, the p-type AlGaAs third upper cladding layer 24, the n-type InGaP current stopping layer 31, the p-type InGaP first upper cladding layer 13, the active layer 12, and the n-type InGaP lower cladding layer 11, to the upper surface of the n-type GaAs substrate 10. In this example, the distance between the pair of open trenches 51 is 30 micrometers.

The above pair of open trenches 51 are provided for controlling the spread of current in the reverse bias pn junctions in the current confinement structure and the active layer during high-frequency operation. In order to form the pair of open trenches 51, etching is continued until the pair of open trenches 51 are formed through the active layer 12 by using, for example, a 1% Br-methanol etching solution and appropriately controlling the etching time. When the semiconductor layers made of GaAs/InGaAsP/InGaP materials are etched with the Br-methanol etching solution, the material dependence of the etching characteristics is small. Therefore, it is possible to form the pair of open trenches 51 so as to have even and smooth internal surfaces.

In addition, an insulation film 15, which is made of a dielectric material such as $SiO_2$ or $Si_3N_4$, is formed so as to cover the internal surfaces of the pair of open trenches 51 and the upper surface of the p-type GaAs contact layer 14 except for an electrode contact opening. The electrode contact opening has a rectangular shape, and extends along the direction of laser light propagation (i.e., the vertical direction in FIG. 2).

Then, a p electrode 16 is formed on an area of the p-type GaAs contact layer 14 which is exposed through the electrode contact opening, and an n electrode 17 is formed on the lower surface of the n-type GaAs substrate 10.

The resonator length in this example is 900 micrometers. Alternatively, the resonator length can be changed in the range from 500 to 2,000 micrometers according to desired output power and use.

Advantages of First Embodiment

If the current confinement structure is not provided, a forward current flows from the p-type InGaP first upper cladding layer 13 through the active layer 12 to the n-type InGaP lower cladding layer 11 when a forward bias voltage is applied between the n electrode 17 and the p electrode 16 in the semiconductor laser device 1 illustrated in FIGS. 1 and 2. However, since the semiconductor laser device 1 as the first embodiment of the present invention includes the current confinement structure, a reverse bias state is realized by the pn junctions between the n-type InGaP current stopping layer 31 and the p-type InGaP first upper cladding layer 13. Therefore, the driving current concentrates in the stripe region (active region) of the active layer which is located under the opening of the n-type InGaP current stopping layer 31. Thus, the semiconductor laser device 1 as the first embodiment of the present invention can be driven by a low driving current.

In addition, when a high-frequency signal is superimposed on the driving current in the conventional semiconductor laser devices, the high-frequency components pass through the pn junctions generated by the current stopping layer due to the great parasitic capacitance generated by the pn junctions, and it is difficult for the driving current to efficiently flow in only the active region. On the other hand, in the semiconductor laser device 1 as the first embodiment of the present invention, the above parasitic capacitance can be remarkably reduced as explained in detail below.

Since the pair of open trenches 51 extend through the p-type GaAs contact layer 14, the p-type AlGaAs third upper cladding layer 24, the n-type InGaP current stopping layer 31, the p-type InGaP first upper cladding layer 13, and the n-type InGaP lower cladding layer 11 in the semiconductor laser device 1, the portions of the above semiconductor layers outside the pair of open trenches 51 are electrically insulated from the portions of the semiconductor layers inside the pair of open trenches 51, and the pn junctions between the n-type InGaP current stopping layer 31 and the p-type AlGaAs third upper cladding layer 24 inside the pair of open trenches 51 are reduced compared with the pn junctions in the conventional semiconductor laser devices. Therefore, the parasitic capacitance is reduced.

In addition, the p-type GaAs contact layer 14 is in contact with the p electrode 16 through only the small electrode contact opening of the insulation film 15. Therefore, the effective area of the p electrode 16 which is actually used for the current injection can be reduced, and the areas of the pn junctions which cause the parasitic capacitance can be minimized. Thus, the parasitic capacitance can be further reduced.

As explained above, in the semiconductor laser device 1 as the first embodiment of the present invention, the parasitic capacitance, which is generated by the provision of the n-type InGaP current stopping layer 31 for realizing the reverse bias pn junctions, can be remarkably reduced. Therefore, the high-frequency characteristics can be greatly improved.

Further, as illustrated in FIG. 2, the p electrode 16 has pad portions 16a, which protrude from the respective sides of the p electrode 16 and are used as terminals for external wiring (electrode pads for wire bonding). Due to the provision of the pad portions 16a, the widths of the portions of the p electrode 16 outside the pair of open trenches 51 can be minimized.

If the widths of the portions of the p electrode 16 outside the pair of open trenches 51 are too great, the p electrode 16, the insulation film 15, and the p-type GaAs contact layer 14 form a capacitor, i.e., parasitic capacitance is generated. In particular, viewed as an electric circuit, this capacitance is connected in parallel with the p electrode 16. Therefore, the parasitic capacitance is unignorable when the ohmic resistance generated at the interface between the p electrode 16 and the p-type GaAs contact layer 14 is great. Thus, in this embodiment, the area of the p electrode 16 is minimized so that almost only the pad portions 16a exist outside the pair of open trenches 51 as illustrated in FIG. 2, and thus the parasitic capacitance is reduced.

Figure 3:
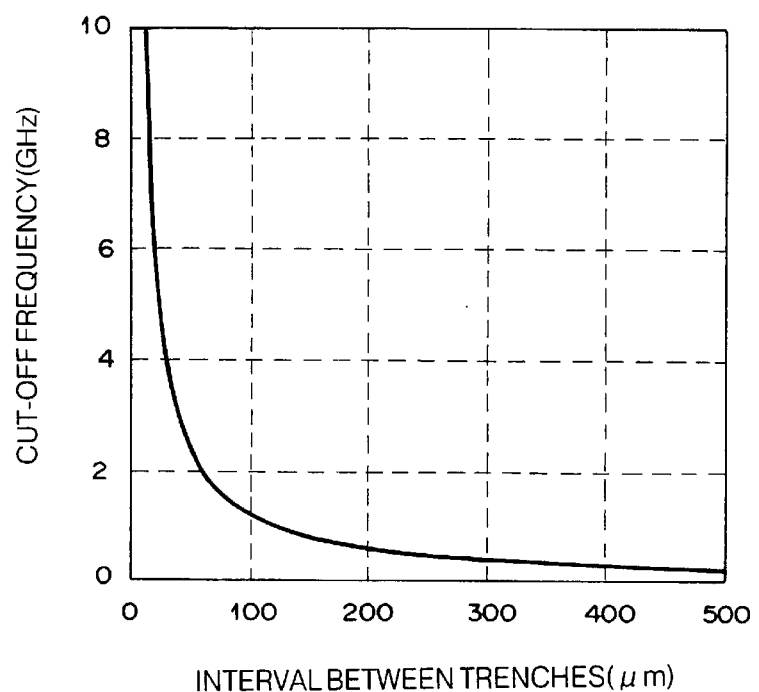
FIG. 3 is a graph indicating a relationship between the interval between the pair of trenches and the cut-off frequency in the semiconductor laser device as the first embodiment of the present invention.

FIG. 3 is a graph indicating a relationship between the interval between the pair of trenches 51 and the cut-off frequency in the semiconductor laser device 1 as the first embodiment of the present invention. As indicated in FIG. 3, the cut-off frequency increases with the decrease in the interval between the pair of trenches 51. In particular, when the interval between the pair of trenches 51 is 100 micrometers or smaller, the cut-off frequency rapidly increases, and therefore higher-frequency components can be satisfactorily cut off. For example, when the interval between the pair of trenches 51 is 100 micrometers, a bandwidth up to about 1 GHz can be obtained.

Figure 4:
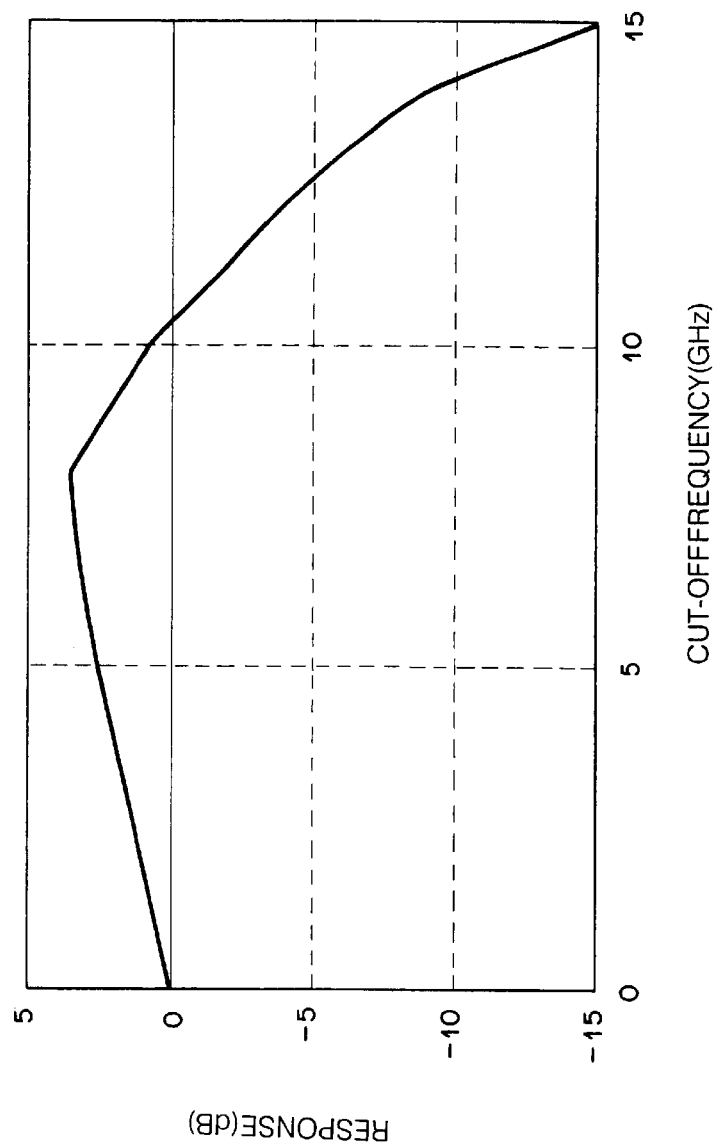
FIG. 4 is a graph indicating a cut-off frequency characteristic of the semiconductor laser device as the first embodiment of the present invention.

FIG. 4 is a graph indicating a cut-off frequency characteristic of the semiconductor laser device 1 as the first embodiment of the present invention. As indicated in FIG. 4, when the interval between the pair of trenches 51 is 30 micrometers, and the p electrode 16 has the shape explained above, the response level falls below 0 dB at a cut-off frequency of 10 GHz or greater. That is, a satisfactory high-frequency characteristic is achieved.

Short-Wavelength Laser Light Source

A short-wavelength laser light source using the semiconductor laser devices 1 as the first embodiment of the present invention is explained with reference to FIG. 5, which is a side view of the short-wavelength laser light source.

Figure 5:
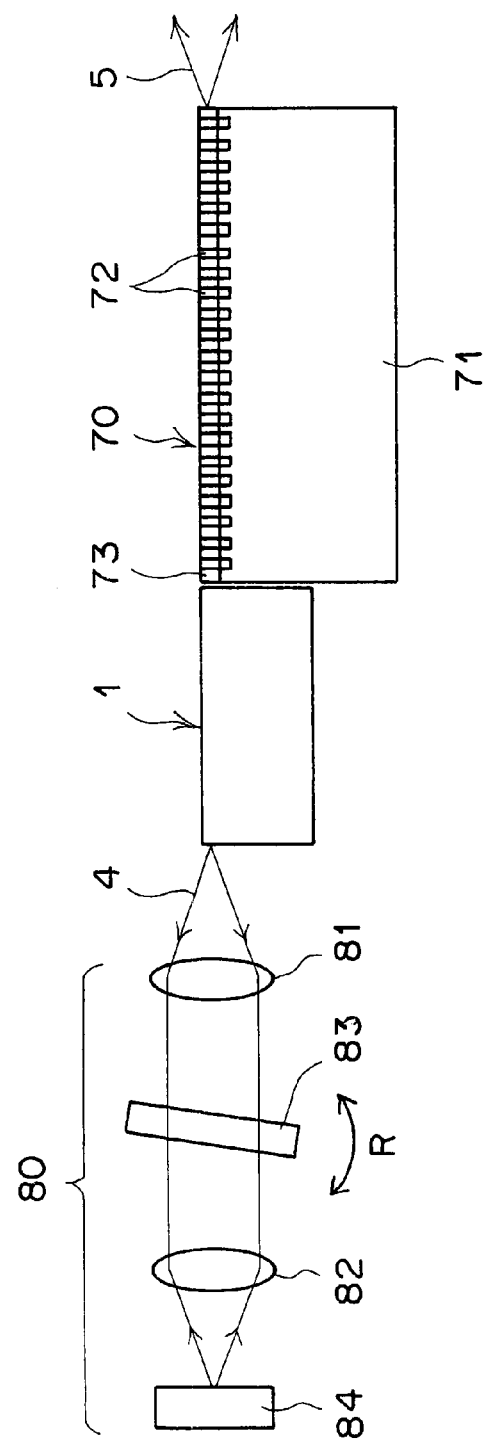
FIG. 5 is a side view of a short-wavelength laser light source using the semiconductor laser devices as the first embodiment of the present invention.
Figure 6:
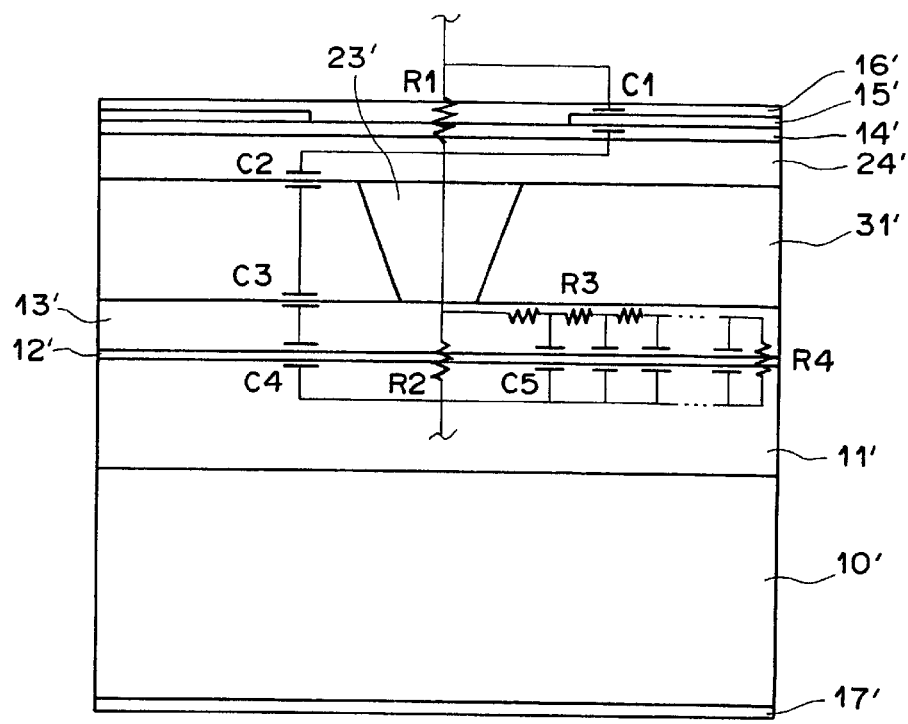
FIG. 6 is a diagram illustrating a vertical cross section and an equivalent circuit of a first conventional semiconductor laser device.
Figure 7:
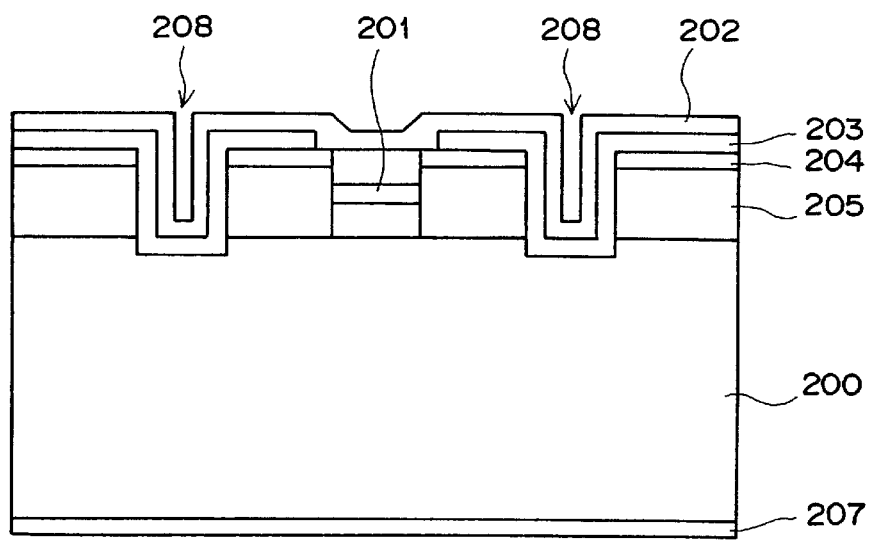
FIG. 7 is a vertical cross-sectional view of a second conventional semiconductor laser device.
Figure 8:
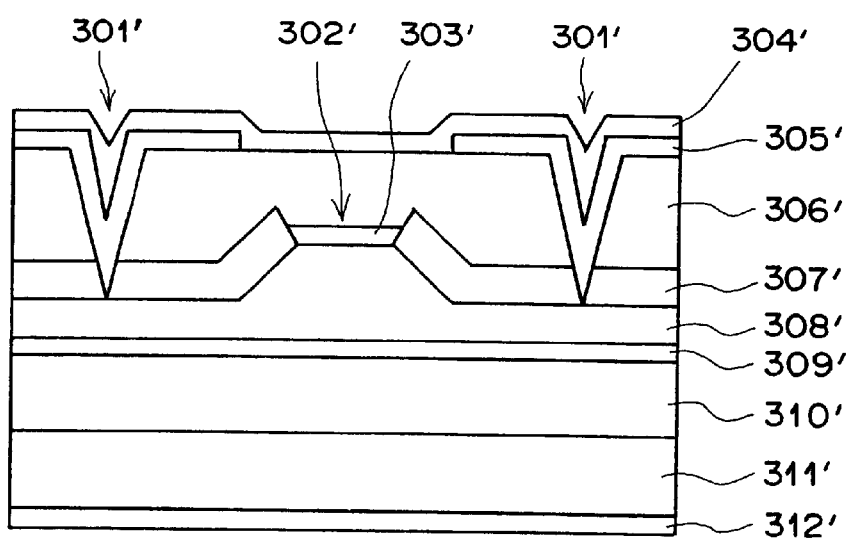
FIG. 8 is a vertical cross-sectional view of a third conventional semiconductor laser device.

The short-wavelength laser light source of FIG. 5 comprises the semiconductor laser device 1, an optical wavelength conversion element 70, and an optical system 80. The optical wavelength conversion element 70 converts a laser beam emitted from the semiconductor laser device 1, into a second harmonic laser beam 5. The optical system 80 selects and locks the oscillation wavelength of the semiconductor laser device 1.

The optical wavelength conversion element 70 is made by forming a periodic domain-inverted structure 72 on a substrate 71 made of a dielectric material exhibiting a nonlinear optical effect, for example, a MgO-doped LiNbO$_3$ (MgO—LiNbO$_3$) crystal. In the periodic domain-inverted structure, the direction of spontaneous polarization is periodically inverted. In addition, an optical channel waveguide 73 is arranged along the periodic domain-inverted structure 72.

The semiconductor laser device 1 is directly coupled to the optical channel waveguide 73, so that the laser beam emitted from the semiconductor laser device 1 is injected into the optical channel waveguide 73. During propagation of the laser beam through the optical channel waveguide 73, phase matching (so-called quasi phase matching) is realized in the periodic domain-inverted structure 72 so that the laser beam emitted from the semiconductor laser device 1 is converted into the second harmonic laser beam 5 having the half wavelength of the oscillation light of the semiconductor laser device 1.

The optical system 80 comprises a collimator lens 81, a condenser lens 82, a wavelength selection filter 83, and a reflection mirror 84. The collimator lens 81 collimates a laser beam 4 (backward emission light), which is emitted as divergent light from the back end facet of the semiconductor laser device 1. The condenser lens 82 condenses the collimated laser beam 4. The wavelength selection filter 83 is a narrow-band-pass filter arranged between the collimator lens 81 and the condenser lens 82, and selects a wavelength of the laser beam 4 so that the oscillation wavelength is locked at the selected wavelength. The reflection mirror 84 is arranged at a position at which the laser beam 4 condensed by the condenser lens 82 converges.

The laser beam 4 emitted from the back end facet of the semiconductor laser device 1 passes through the collimator lens 81, the wavelength selection filter 83, and the condenser lens 82, and is reflected by the reflection mirror 84 so that the reflected laser beam 4 is returned to the semiconductor laser device 1 through the condenser lens 82, the wavelength selection filter 83, and the collimator lens 81. At this time, the wavelength of the laser beam 4 is selected by the wavelength selection filter 83. Thus, the oscillation wavelength of the semiconductor laser device 1 is locked at the selected wavelength. The selected wavelength can be changed by rotating the wavelength selection filter 83 in the directions as indicated by the arrows R in FIG. 5.

The applicant has obtained about 100 mW as the output power of the second harmonic laser beam 5 having a green wavelength of 530 nm when the oscillation wavelength of the semiconductor laser device 1 is 1,060 nm, the output power of the semiconductor laser device 1 is 100 mW, and the coupling efficiency of the direct coupling between the semiconductor laser device 1 and the optical wavelength conversion element 70 is 80%.

In addition, the applicant has confirmed that when a high-frequency component of 350 MHz is superimposed on the driving current, the superimposition becomes efficient, and a second harmonic laser beam 5 having stable wavelength and output power is obtained through the optical wavelength conversion element 70. Specifically, the applicant has also confirmed that the variation in the output power in the case where the high-frequency component is superimposed on the driving current is 1% or lower, while the variation in the output power in the case where no high-frequency component is superimposed on the driving current is about 30%.

Construction of Second Embodiment

Figure 9:
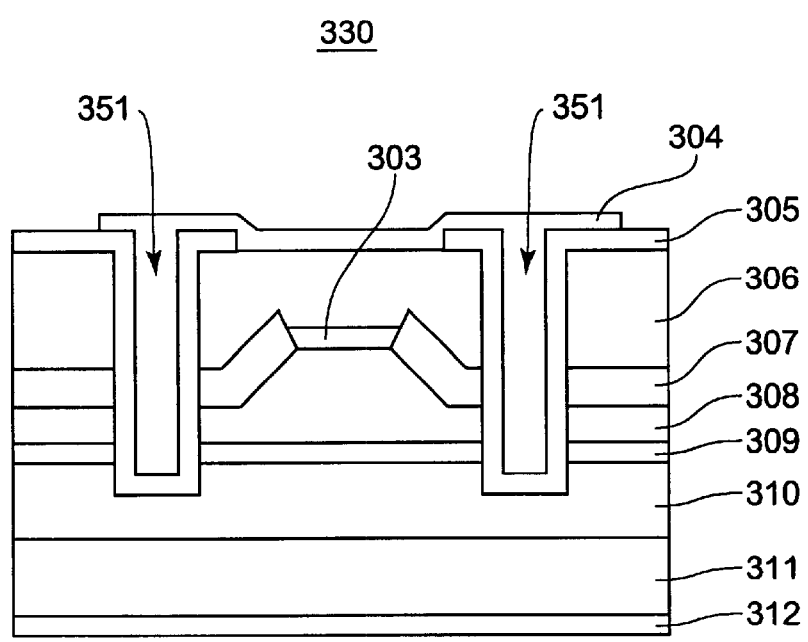
FIG. 9 is a vertical cross-sectional view of a semiconductor laser device as a second embodiment of the present invention.
Figure 10:
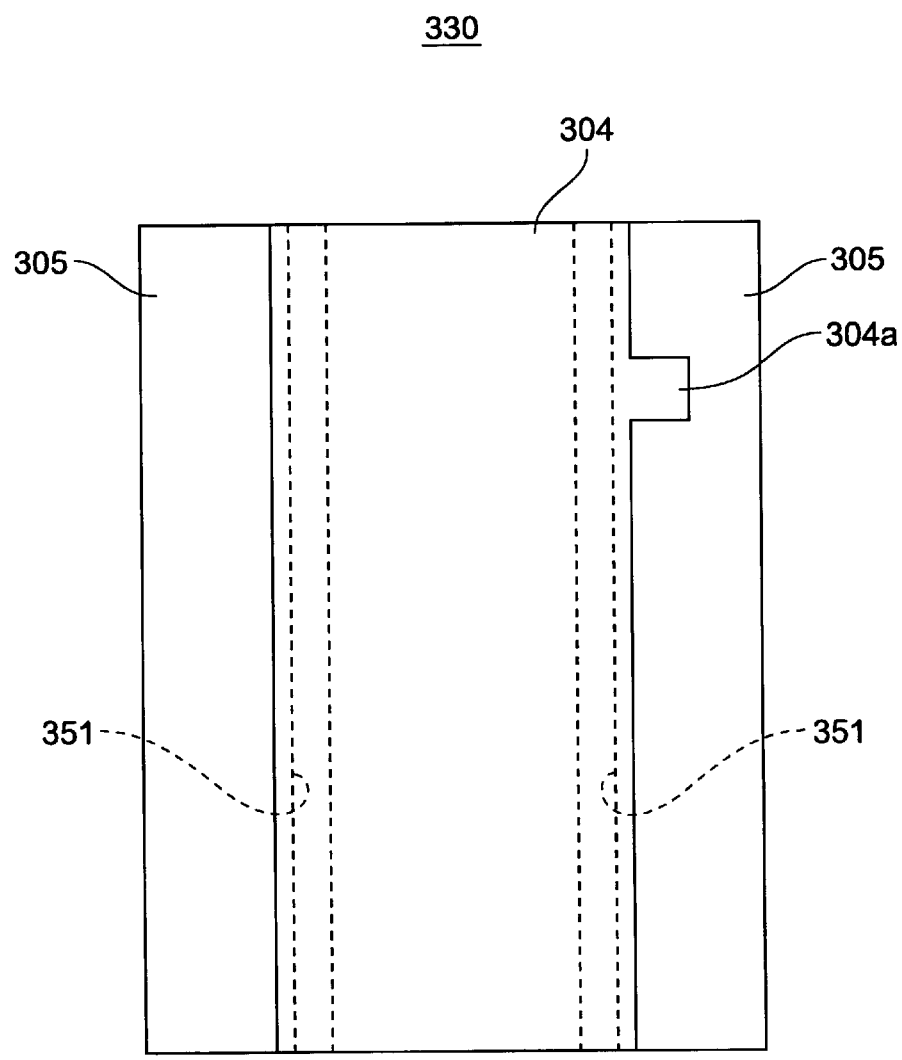
FIG. 10 is a plan view of the semiconductor laser device as the second embodiment of the present invention.

FIGS. 9 and 10 are vertical cross-sectional and plan views of the semiconductor laser device as the second embodiment of the present invention.

As illustrated in FIGS. 9 and 10, in the semiconductor laser device 330 as the second embodiment, an n-type AlGaInP lower cladding layer 310, semiconductor multiple layers 309, a p-type AlGaInP upper cladding layer 308, and a p-type InGaP protection layer 303 are formed on an n-type GaAs substrate 311, where the semiconductor multiple layers 309 include an i-type AlGaInP barrier layer, an i-type InGaP quantum-well active layer, and an i-type AlGaInP barrier layer. Hereinafter, the semiconductor multiple layers 309 are collectively referred to as an active layer 309.

Next, predetermined regions of the p-type InGaP protection layer 303 and the p-type AlGaInP upper cladding layer 308 are etched off so as to form a ridge stripe corresponding to an emission region. Then, an n-type GaAs current stopping layer 307 is formed in the etched-off regions so as to have an opening on the top of the ridge stripe. Subsequently, a p-type GaAs contact layer 306 is formed over the ridge stripe and the n-type GaAs current stopping layer 307. Thus, a reverse bias state is realized by pn junctions between the n-type GaAs current stopping layer 307 and the p-type AlGaInP upper cladding layer 308.

In addition, a pair of open trenches 351 are formed on both sides of the opening of the n-type GaAs current stopping layer 307 along a stripe region into which current is to be injected. The pair of open trenches 351 extend through the p-type GaAs contact layer 306, the n-type GaAs current stopping layer 307, the p-type AlGaInP upper cladding layer 308, and the active layer 309, to a mid-thickness of the n-type AlGaInP lower cladding layer 310. In this example, the distance between the pair of open trenches 351 is 10 micrometers.

The above pair of open trenches 351 are provided for controlling the spread of current in the reverse bias pn junctions realizing a current confinement structure and the active layer during high-frequency operation. In order to form the pair of open trenches 351, etching is continued until the pair of open trenches 351 are formed through the active layer 309 by using, for example, a 1% Br-methanol etching solution and appropriately controlling the etching time. When the semiconductor layers made of GaAs/AlGaInP/ InGaP materials are etched with the Br-methanol etching solution, the material dependence of the etching characteristics is small. Therefore, it is possible to form the pair of open trenches 351 so as to have even and smooth internal surfaces.

In addition, an insulation film 305, which is made of a dielectric material such as SiO2 or Si3N4, is formed so as to cover the internal surfaces of the pair of open trenches 351 and the upper surface of the p-type GaAs contact layer 306 except for an electrode contact opening. The electrode contact opening has a rectangular shape, and extends along the direction of laser light propagation (i.e., the vertical direction in FIG. 10).

Then, a p electrode 304 is formed on an area of the p-type GaAs contact layer 306 which is exposed through the electrode contact opening, and an n electrode 312 is formed on the lower surface of the n-type GaAs substrate 311.

Further, as illustrated in FIG. 10, the p electrode 304 has a pad portion 304a, which protrudes from one side of the p electrode 304 and is used as a terminal for external wiring (an electrode pad for wire bonding). Due to the provision of the pad portion 304a, the width of the portion of the p electrode 304 outside the pair of open trenches 351 can be minimized. In this example, the pad portion 304a has a rectangular shape, where one side of the pad portion 304a has a length of 30 micrometers.

In the semiconductor laser device 330 as the second embodiment, the applicant has obtained a maximum optical output of 30 mW at the oscillation wavelength of 650 nm.

The resonator length in this example is 300 micrometers. Alternatively, the resonator length can be changed in the range from 250 to 2,000 micrometers according to desired output power and use.

Advantages of Second Embodiment

For reasons similar to the reasons explained before for the first embodiment, it is possible to remarkably reduce the parasitic capacitance caused by the n-type GaAs current stopping layer 307 which realizes the reverse-biased pn junctions in the semiconductor laser device 330 as the second embodiment. Therefore, the high-frequency characteristics can be greatly improved. The applicant has evaluated the cut-off frequency characteristic of the semiconductor laser device 330, and obtained a result that the response level falls below 0 dB at a cut-off frequency of 8 GHz or greater. That is, a satisfactory high-frequency characteristic is achieved.

Figure 11A:
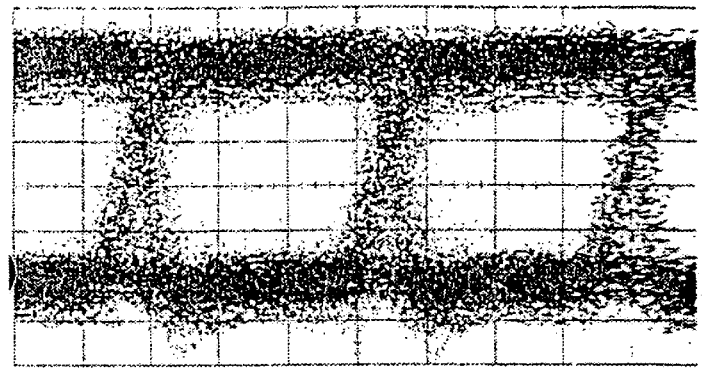
FIGS. 11A and 11B are eye diagrams respectively indicating eye patterns before and during transmission.
Figure 11B:
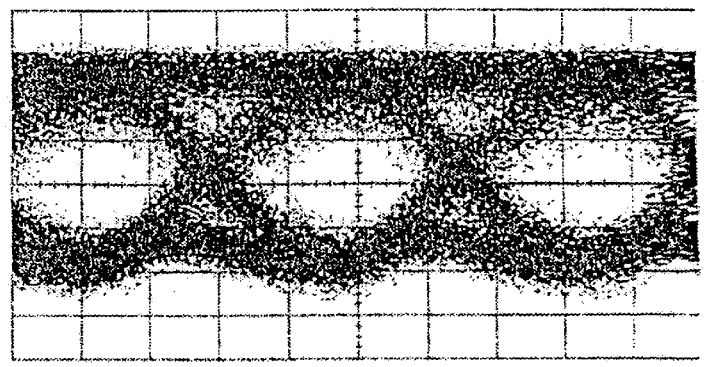

The applicant has also evaluated a transmission characteristic of a construction in which the semiconductor laser device 330 is coupled to a plastic fiber having a length of 100 m. FIGS. 11A and 11B are eye diagrams respectively indicating eye patterns before and during transmission. In the transmission, the transmission rate is 5 Gb/s. As indicated in FIGS. 11A and 11B, a clear eye pattern is obtained during the transmission. That is, a satisfactory transmission characteristic is achieved.

What is claimed is:

1. A semiconductor laser device comprising:

a substrate;

an active layer formed above said substrate;

a current confinement structure which is realized by p-type and n-type layers being formed above said active layer and including a current stopping layer which has an opening for allowing current injection into only a predetermined stripe region of the active layer;

a semiconductor layer formed above said current confinement structure;

a pair of trenches formed on both sides said opening along said predetermined stripe region so as to extend from said semiconductor layer through said current stopping layer to at least said active layer;

an insulation film formed on said semiconductor layer except that an area of the semiconductor layer located right above said predetermined stripe region is not covered by the insulation film; and an electrode formed on said area of the semiconductor layer, wherein said pair of trenches are separated by an interval of 100 micrometers or smaller.

2. A semiconductor laser device according to claim 1, wherein said electrode has at least one area each protruding in a lateral direction and being used for wire bonding.

3. A semiconductor laser device according to claim 1, wherein said substrate is made of GaAs, said active layer is a quantum-well active layer made of an InGaAs material, and said semiconductor laser device emits laser light having a wavelength within a range from 0.9 to 1.2 micrometers.

4. A semiconductor laser device according to claim 1, wherein said substrate is made of GaAs, said active layer is made of an InGaP or AlGaInP material.

5. A short-wavelength laser light source comprising;

a semiconductor laser element which emits a fundamental harmonic laser beam; and an optical wavelength conversion element which converts said fundamental harmonic laser beam into a second harmonic laser beam;

wherein said semiconductor laser element comprises a pair of trenches being separated by an interval of 100 micrometers or smaller, includes, a substrate, an active layer formed above said substrate, a current confinement structure which is realized by p-type and n-type layers being formed above said active layer and including a current stopping layer which has an opening for allowing current injection into only a predetermined stripe region of the active layer, a semiconductor layer formed above said current confinement structure, a pair of trenches formed on both sides of said opening along said predetermined stripe region so as to extend from said semiconductor layer through said current stopping layer to at least said active layer, an insulation film formed on said semiconductor layer except that an area of the semiconductor layer located right above said predetermined stripe region is not covered by the insulation film, and an electrode formed on said area of the semiconductor layer.

6. A semiconductor laser device comprising:

a substrate;

an active layer formed above said substrate;

a current confinement structure which is realized by p-type and n-type layers being formed above said active layer;

a semiconductor layer formed above said current confinement structure;

a pair of trenches formed on both sides of an opening along a predetermined stripe region so as to extend from said semiconductor layer through said current confinement structure at least said active layer; and an electrode formed on said area of the semiconductor layer, wherein said pair of trenches are separated by an interval of 100 micrometers or smaller.

7. The laser device of claim 6, wherein said current confinement structure includes a current stopping layer which has said opening for allowing current injection into only said predetermined stripe region of the active layer.

8. The laser device of claim 7, further comprising an insulation film formed on said semiconductor layer except that an area of the semiconductor layer located right above said predetermined stripe region is not covered by the insulation film.

9. The laser device of claim 1, wherein in the current confinement structure, the p-type and n-type layers are arranged as an upper and a lower layer formed one on top of the other to form a p-n junction, the lower layer being formed entirely over said active layer.

10. The laser device of claim 1, wherein in the current confinement structure, the p-type and n-type layers are formed as an upper and a lower layer formed one on top of the other to form a p-n junction, the lower layer being formed in direct contact with an upper surface of the active layer.

11. A semiconductor laser device according to claim 7, wherein said substrate is made of GaAs, said active layer is a quantum-well active layer made of an InGaAs material, and said semiconductor laser device emits laser light having a wavelength within a range from 0.9 to 1.2 micrometers.

12. A semiconductor laser device according to claim 8, wherein said substrate is made of GaAs, said active layer is a quantum-well active layer made of an InGaAs material, and said semiconductor laser device emits light having a wavelength within a range from 0.9 to 1.2 micrometers.

13. A semiconductor laser device according to claim 7, wherein said substrate is made of GaAs, said active layer is made of an InGaP or AlGaInP material.

14. A semiconductor laser device according to claim 8, wherein said substrate is made of GaAs, said active layer is made of an InGaP or AlGaInP material.

15. A semiconductor laser device according to claim 2, wherein said substrate is made of GaAs, said active layer is a quantum-well active layer made of an InGaAs material, and said semiconductor laser device emits laser light having a wavelength within a range from 0.9 to 1.2 micrometers.

16. A semiconductor laser device according to claim 2, wherein said substrate is made of GaAs, said active layer is made of an InGaP or AlGaInP material.

17. A semiconductor laser device according to claim 7, wherein said electrode has at least one area each protruding in a lateral direction and being used for wire bonding, wherein said substrate is made of GaAs, said active layer is a quantum-well active layer made of an InGaAs material, and said semiconductor laser device emits laser light having a wavelength within a range from 0.9 to 1.2 micrometers.

18. A semiconductor laser device according to claim 8, wherein said electrode has at least one area each protruding in a lateral direction and being used for wire bonding, wherein said substrate is made of GaAs, said active layer is a quantum-well active layer made of an InGaAs material, and said semiconductor laser device emits laser light having a wavelength within a range from 0.9 to 1.2 micrometers.

19. A semiconductor laser device according to claim 7, wherein said electrode has at least one area each protruding in a lateral direction and being used for wire bonding, wherein said substrate is made of GaAs, said active layer is made of an InGaP or AlGaInP material.

20. A semiconductor laser device according to claim 8, wherein said electrode has at least one area each protruding in a lateral direction and being used for wire bonding, wherein said substrate is made of GaAs, said active layer is made of an InGaP or AlGaInP material.

* * * * *